(12) United States Patent
Suzuki et al.

(10) Patent No.: US 8,294,244 B2
(45) Date of Patent: Oct. 23, 2012

(54) SEMICONDUCTOR DEVICE HAVING AN ENLARGED EMITTER ELECTRODE

(75) Inventors: Kenji Suzuki, Tokyo (JP); Yoshifumi Tomomatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 258 days.

(21) Appl. No.: 12/721,827

(22) Filed: Mar. 11, 2010

(65) Prior Publication Data

US 2011/0049562 A1    Mar. 3, 2011

(30) Foreign Application Priority Data

Aug. 27, 2009  (JP) .................................. 2009-197127

(51) Int. Cl.
*H03K 3/021* (2006.01)
*H03K 19/013* (2006.01)

(52) U.S. Cl. ............... 257/578; 257/579; 257/E29.197; 257/E29.202; 257/E21.382; 438/133; 438/342; 438/343

(58) Field of Classification Search .................. 257/273, 257/361, 370, 378, 578–579, E29.027, E29.066, 257/E29.197, E29.198, E29.199, E29.2, E29.201, 257/E29.202, E21.382–E21.387; 438/133, 438/135–138, 309, 322, 342–345
See application file for complete search history.

(56) References Cited

U.S. PATENT DOCUMENTS

| | | | | |
|---|---|---|---|---|
| 5,530,277 A * | 6/1996 | Otsuki et al. | ................. | 257/378 |
| 5,708,281 A * | 1/1998 | Morishita | ..................... | 257/198 |
| 6,518,624 B2 * | 2/2003 | Kim et al. | ...................... | 257/330 |
| 6,621,133 B1 * | 9/2003 | Chen et al. | ..................... | 257/409 |
| 6,680,513 B2 * | 1/2004 | Tomomatsu | ................... | 257/359 |
| 6,781,200 B2 * | 8/2004 | Ishimura et al. | .............. | 257/330 |
| 6,870,200 B2 * | 3/2005 | Yanagisawa | ................... | 257/139 |
| 6,967,357 B1 * | 11/2005 | Kon et al. | ...................... | 257/133 |
| 7,488,662 B2 * | 2/2009 | Zhang et al. | ................... | 438/309 |
| 7,576,392 B2 | 8/2009 | Kawano et al. | | |
| 2003/0146493 A1 * | 8/2003 | Tomomatsu | ................... | 257/566 |
| 2005/0032280 A1 * | 2/2005 | Yanagisawa | ................... | 438/138 |
| 2005/0139958 A1 * | 6/2005 | Mallikarjunaswamy | ..... | 257/565 |
| 2006/0097267 A1 | 5/2006 | Kumar et al. | | |
| 2007/0096172 A1 * | 5/2007 | Tihanyi et al. | ............... | 257/288 |
| 2007/0120181 A1 * | 5/2007 | Ruething et al. | .............. | 257/328 |

(Continued)

FOREIGN PATENT DOCUMENTS

EP        1 009 035 A1    6/2000

(Continued)

OTHER PUBLICATIONS

U.S. Appl. No. 13/206,808, filed Aug. 10, 2011, Suzuki.

(Continued)

*Primary Examiner* — Matthew Landau
*Assistant Examiner* — Maliheh Malek
(74) *Attorney, Agent, or Firm* — Oblon, Spivak, McClelland, Maier & Neustadt, L.L.P.

(57) ABSTRACT

A semiconductor device comprises: a semiconductor substrate; a plurality of IGBT cells on the semiconductor substrate, each of the IGBT cells including a gate electrode and a first emitter electrode; a first gate wiring on the substrate and being connected to the gate electrode; an interlayer insulating film covering the first emitter electrode and the first gate wiring; and a second emitter electrode on the interlayer insulating film and being connected to the first emitter electrode through an opening of the interlayer insulating film, wherein the second emitter electrode extends above the first gate wiring via the interlayer insulating film.

9 Claims, 10 Drawing Sheets

U.S. PATENT DOCUMENTS

| | | | |
|---|---|---|---|
| 2007/0176205 A1* | 8/2007 | Hatade | 257/197 |
| 2008/0006906 A1* | 1/2008 | Hatade | 257/586 |
| 2008/0048295 A1* | 2/2008 | Takahashi | 257/565 |
| 2008/0079066 A1* | 4/2008 | Hamaguchi et al. | 257/330 |
| 2008/0079069 A1* | 4/2008 | Suekawa | 257/330 |
| 2008/0135871 A1* | 6/2008 | Ruething et al. | 257/139 |
| 2008/0179671 A1 | 7/2008 | Saito et al. | |
| 2008/0251909 A1* | 10/2008 | Tokuyama et al. | 257/706 |
| 2008/0290407 A1* | 11/2008 | Kusunoki et al. | 257/334 |
| 2009/0001411 A1* | 1/2009 | Tokura et al. | 257/140 |
| 2009/0283797 A1* | 11/2009 | Takahashi et al. | 257/139 |
| 2010/0059028 A1* | 3/2010 | Ueno | 123/652 |
| 2010/0193835 A1* | 8/2010 | Hshieh | 257/139 |
| 2010/0219447 A1* | 9/2010 | Hatade | 257/139 |
| 2011/0012130 A1* | 1/2011 | Zhang | 257/77 |
| 2011/0018028 A1* | 1/2011 | Hatade | 257/139 |
| 2011/0018029 A1* | 1/2011 | Pfirsch et al. | 257/147 |
| 2012/0056242 A1* | 3/2012 | Tsuzuki et al. | 257/140 |

FOREIGN PATENT DOCUMENTS

| | | |
|---|---|---|
| JP | 7-183302 | 7/1995 |
| JP | 8-125181 | 5/1996 |
| JP | 2000-58820 | 2/2000 |
| JP | 2005-203474 | 7/2005 |
| JP | 2006-270112 | 10/2006 |
| JP | 2008-135536 | 6/2008 |

OTHER PUBLICATIONS

German Office Action issued May 3, 2012 in Patent Application No. 10 2010 038 641.3 with English Translation.

* cited by examiner

SEMICONDUCTOR DEVICE HAVING AN ENLARGED EMITTER ELECTRODE

BACKGROUND OF THE INVENTION

1. Field of the Invention

The present invention relates to a semiconductor device having an enlarged emitter electrode and a method for the manufacture thereof.

2. Background Art

An IGBT (insulated gate bipolar transistor) is used in power converters, such as an inverter (for example, refer to Japanese Patent Laid-Open No. 2008-135536). In order to improve the operating characteristics of the IGBT, a review of the structure of IGBT cells and the optimization of the wafer thicknesses have been carried out. However, the improvement of performances by such means is reaching a limit. Therefore, it has been examined to lower current density by enlarging the area of an emitter electrode relative to the area of a chip.

SUMMARY OF THE INVENTION

In order to enlarge the area of an emitter electrode without enlarging the area of a chip, it is sufficient to make the areas of a gate pad, gate wirings, and the terminating region smaller. However, the size of a gate pad is constrained by the area contacting the exterior, for example, by the wire diameter of an Al wire. Furthermore, reducing the number of gate wirings causes imbalance operation between IGBT cells connected in parallel. Depending on the rated current of an IGBT chip, since several amperes of gate current may flow in several microseconds in ON-OFF switching, the width of gate wirings is constrained by electromigration. In addition, it is impossible in principle to reduce the thickness of the terminating region to the thickness of the N⁻ layer in the vertical direction or thinner. Furthermore, if the terminating region is made excessively small, the problem of quality is a concern. Therefore, it has not been possible to enlarge the emitter electrode.

Recently, a large number of products utilize a transfer molding technique. However, due to difference in the coefficient of thermal expansion between the molded resin and the semiconductor substrate, electrodes on the semiconductor substrate are peeled off (slide) over time by the stress of the molded resin. In order to prevent this phenomenon, the electrode is thinned to lower bumps. However, since the above-described constraint of the width of gate wirings or damage to the cell portion during wire bonding is concerned, there is a limit in thinning the electrodes. Although the protection of wiring by polyimide coating is also considered, this will cause the elevation of the costs.

Considering the solution of the above-described problems, it is the first object of the present invention is to provide a semiconductor device having an enlarged emitter electrode and a method for the manufacture thereof. The second object of the present invention is to provide a semiconductor device that can prevent the slide of the electrode due to the stress of the molded resin and a method for the manufacture thereof.

According to one aspect of the present invention, a semiconductor device comprises: a semiconductor substrate; a plurality of IGBT cells on the semiconductor substrate, each of the IGBT cells including a gate electrode and a first emitter electrode; a first gate wiring on the substrate and being connected to the gate electrode; an interlayer insulating film covering the first emitter electrode and the first gate wiring; and a second emitter electrode on the interlayer insulating film and being connected to the first emitter electrode through an opening of the interlayer insulating film, wherein the second emitter electrode extends above the first gate wiring via the interlayer insulating film. Other and further objects, features and advantages of the invention will appear more fully from the following description.

The present invention can provide a semiconductor device having an enlarged emitter electrode.

Other and further objects, features and advantages of the invention will appear more fully from the following description.

BRIEF DESCRIPTION OF THE DRAWINGS

FIG. 16 corresponds to FIG. 7 of the first embodiment.

DETAILED DESCRIPTION OF THE PREFERRED EMBODIMENTS

Figure 1:
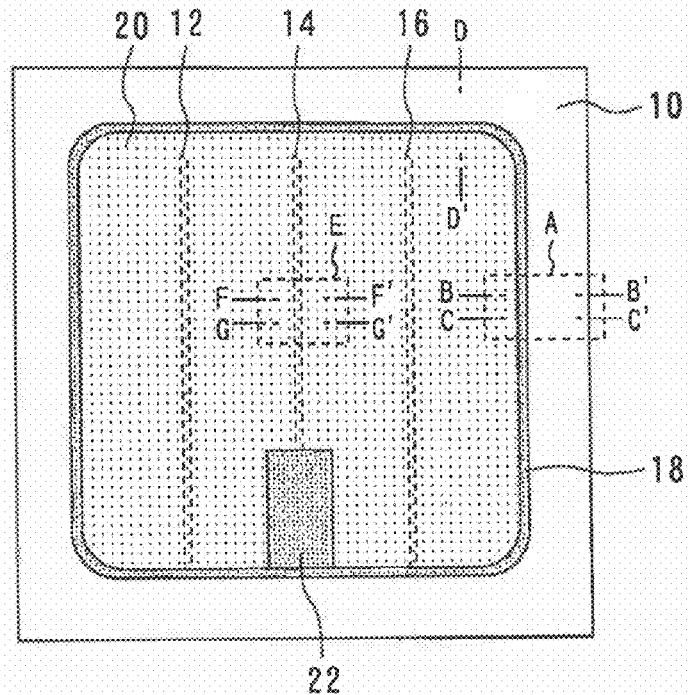
FIG. 1 is a top view of a semiconductor device according to a first embodiment of the present invention.

Now, embodiments of the present invention will be described with reference to the drawings. Same reference numerals denote same components throughout the drawings, and redundant descriptions will be omitted.

First Embodiment

FIG. 1 is a top view of a semiconductor device according to a first embodiment of the present invention. The semiconductor device is a trench type IGBT.

On an n-type Si substrate 10 (semiconductor substrate), lower layer gate wirings 12, 14, 16, an upper layer gate wiring 18, a second emitter electrode 20 and a gate pad 22 composed of Al are formed. The gate wirings 12, 14, 16, and 18 are connected to the gate pad 22. The ring-shaped upper layer gate wiring 18 is disposed outside the second emitter electrode 20 on the n-type Si substrate 10. Linear lower layer gate wirings 12, 14, 16 (first gate wirings) are disposed under the second emitter electrode 20.

The second emitter electrode 20 is, for example, wire-bonded, and an emitter current (major current) is inputted from the exterior. Under the second emitter electrode 20, a plurality of IGBT cells (described later) are formed. The gate pad 22 is, for example, wire-bonded, and a gate voltage is inputted from the exterior. Gate wirings 12, 14, 16, and 18 apply gate voltage to the gate electrodes of IGBT cells connected in parallel.

Figure 2:
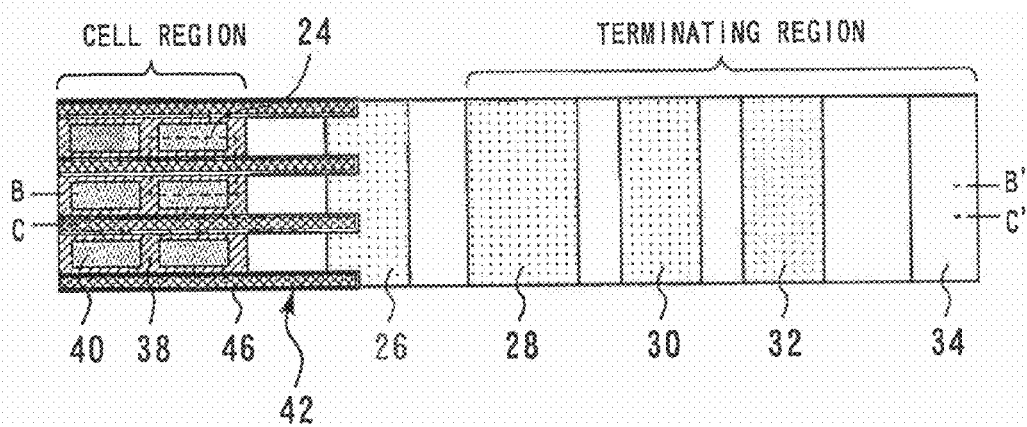
FIG. 2 is an enlarged top view showing the surface of an n-type Si substrate in the region A in FIG. 1.
Figure 3:
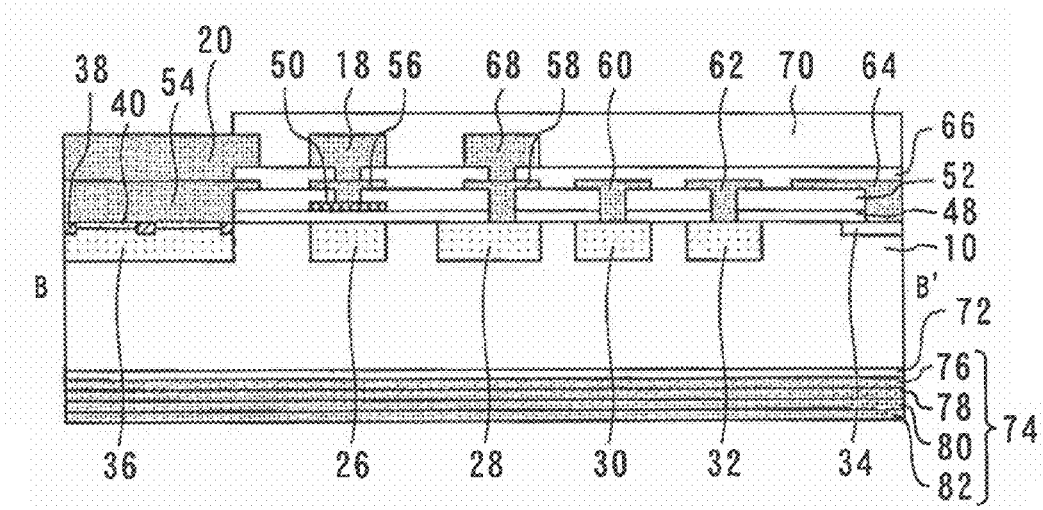
FIG. 3 is a sectional view taken along lines B-B' in FIGS. 1 and 2.
Figure 4:
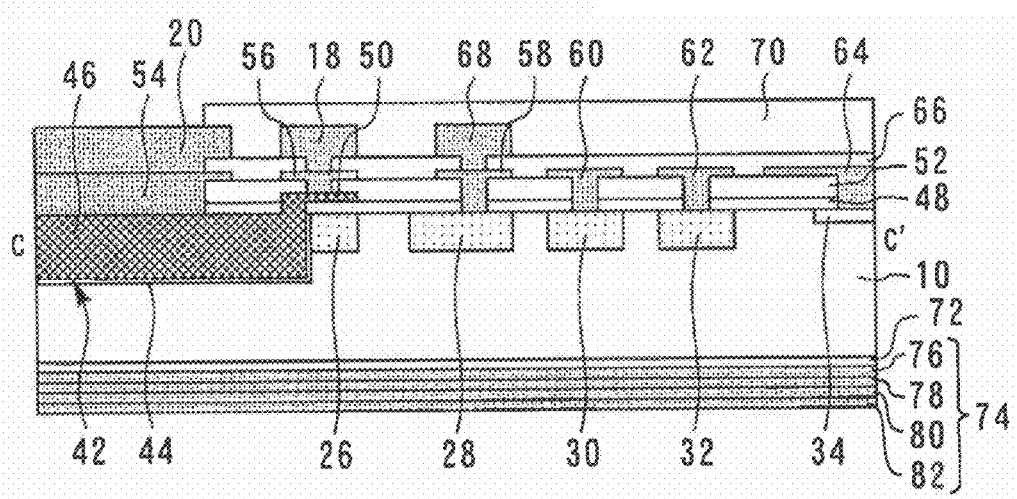
FIG. 4 is a sectional view taken along lines C-C' in FIGS. 1 and 2.
Figure 5:
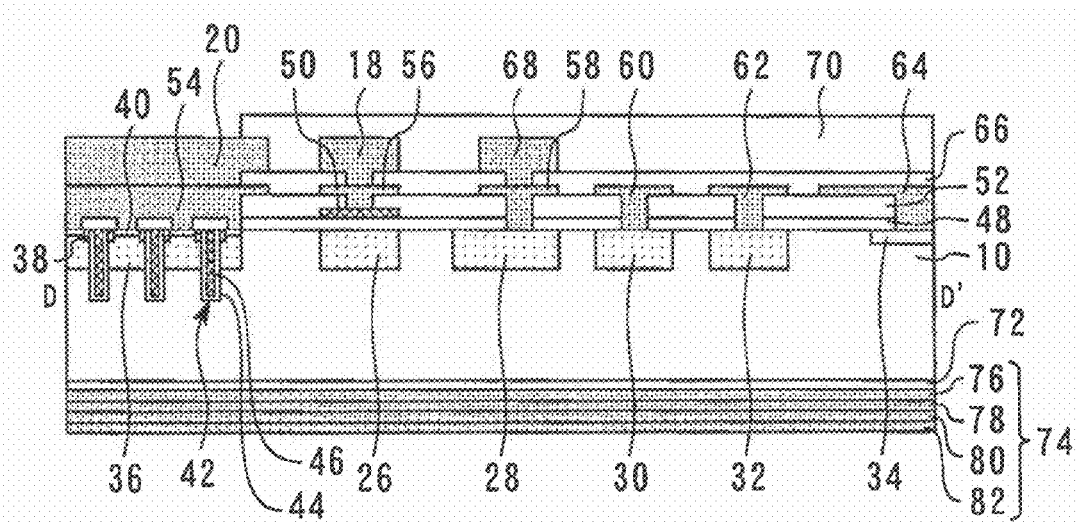
FIG. 5 is a sectional view taken along line D-D' in FIG. 1.

FIG. 2 is an enlarged top view showing the surface of an n-type Si substrate in the region A in FIG. 1. FIG. 3 is a sectional view taken along lines B-B' in FIGS. 1 and 2. FIG. 4 is a sectional view taken along lines C-C' in FIGS. 1 and 2. FIG. 5 is a sectional view taken along line D-D' in FIG. 1.

The lower region of the second emitter electrode 20 is a cell region wherein a plurality of IGBT cells 24 are formed on the n-type Si substrate 10. On the upper surface of the n-type Si substrate 10, ring-shaped p-wells 26, 28, 30, 32, and a channel stopper 34 are formed outward from the cell region. Among these, the p-wells 28, 30, 32 and the channel stopper 34 are formed in the terminating region of the n-type Si substrate 10.

In the cell region, a p-type base region 36 is selectively formed on the upper surface of the n-type Si substrate 10. In the p-type base region 36, an $n^+$-type emitter region 38 and a $p^+$-type region 40 are selectively formed.

In the manner to penetrate through the p-type base region 36, a trench 42 is formed. In the trench 42, a gate insulating film 44 is formed. On the gate insulating film 44, a gate electrode 46 is formed. Channels are formed in the p-type base region 36 along the trench 42.

On the n-type Si substrate 10, an oxide film 48 (insulating film) is formed. On the p-well 26, a gate electrode 50 is formed via the oxide film 48. The gate electrode 50 is connected to the gate electrodes 46 of a plurality of IGBT cells 24 through the opening of the oxide film 48. The gate electrode 50 is covered with the interlayer insulating film 52. On the interlayer insulating film 52, a first emitter electrode 54, a lower layer gate wiring 56 (second gate wiring) and first field plate electrodes 58, 60, 62, and 64, composed of Al, are formed. However, the first field plate electrodes 58, 60, 62, and 64 are formed on the terminating region of the n-type Si substrate 10.

The first emitter electrode 54 is connected to the $n^+$-type emitter region 38 and the $p^+$-type region 40 via the openings of the oxide film 48 and the interlayer insulating film 52. The lower layer gate wiring 56 is connected to the gate electrode 50 via the opening of the interlayer insulating film 52. First field plate electrodes 58, 60, 62, and 64 are connected to p-wells 28, 30 and 32, and channel stopper 34 via the oxide film 48 and the opening of the interlayer insulating film 52.

The first emitter electrode 54, the lower layer gate wiring 56, and the first field plate electrodes 58, 60, 62, 64 are covered with the interlayer insulating film 66. On the interlayer insulating film 52, the second emitter electrode 20, upper layer gate wiring 18 (third gate wiring), and the second field plate electrode 68 composed of Al are formed. The second emitter electrode 20, the upper layer gate wirings 18, and the second field plate electrode 68 are connected to the first emitter electrode 54, the lower layer gate wiring 56, and the first field plate electrode 58, respectively, via the opening of the interlayer insulating film 66. The upper layer gate wirings 18 and the second field plate electrode 68 are covered with a semi-insulating protective film 70, such as a silicon nitride film. The width of the upper layer gate wiring 18 is larger than the width of the lower layer gate wirings 56, and the second field plate electrode 68 is thicker than the first field plate electrodes 58, 60, 62, and 64.

On the lower surface of the n-type Si substrate 10, a p-type collector region 72 is formed. A collector electrode 74 is connected to the p-type collector region 72. The collector electrode 74 is formed by sequentially laminating an Al layer 76, a Ti layer 78, a Ni layer 80, and an Au layer 82 from the substrate side.

Figure 6:
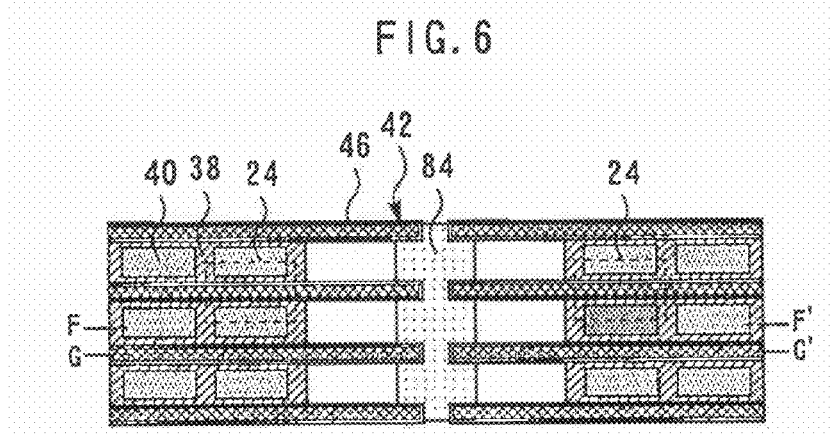
FIG. 6 is an enlarged top view showing the surface of an n-type Si substrate in the region E shown in FIG. 1.
Figure 7:
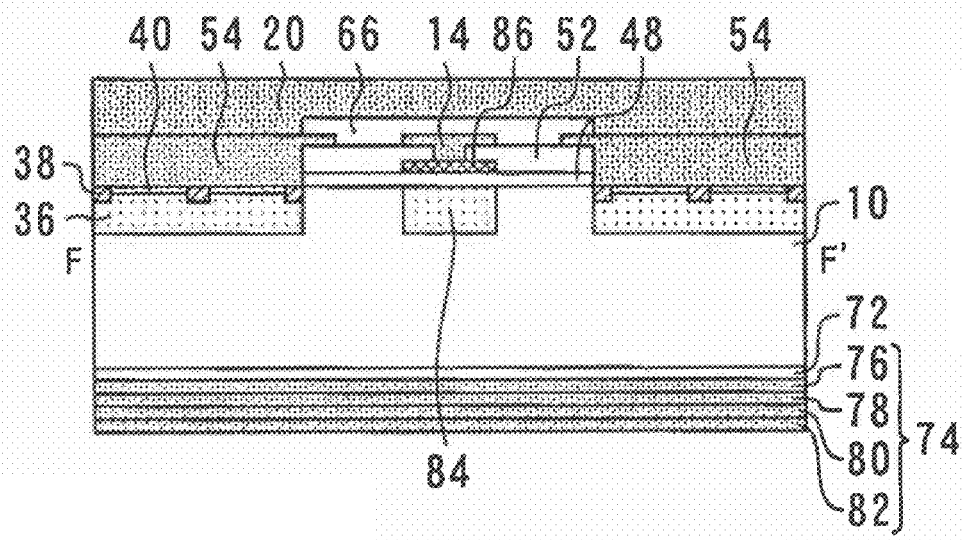
FIG. 7 is a sectional view taken along the line F-F' in FIGS. 1 and 6.
Figure 8:
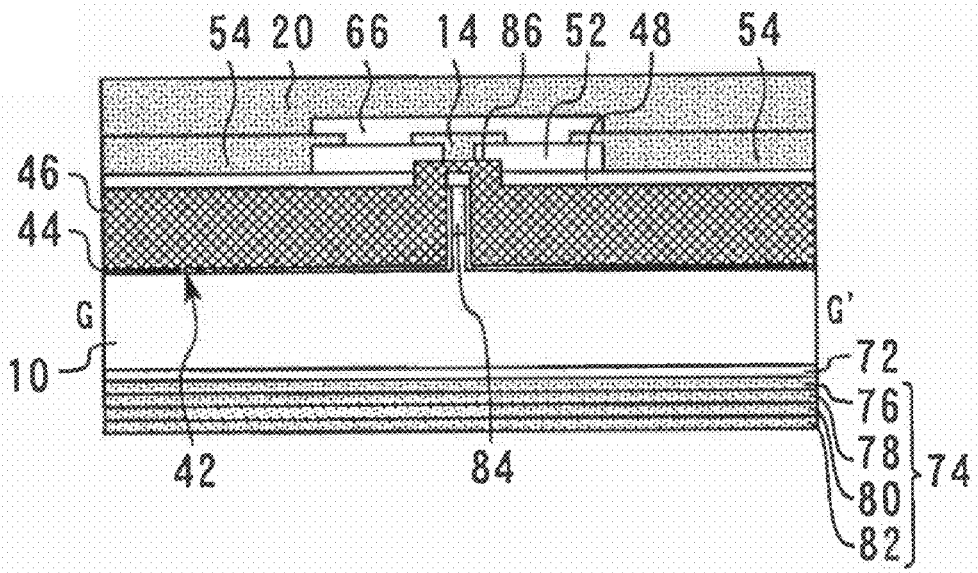
FIG. 8 is a sectional view taken along the line G-G' in FIGS. 1 and 6.

FIG. 6 is an enlarged top view showing the surface of an n-type Si substrate in the region E shown in FIG. 1. FIG. 7 is a sectional view taken along the line F-F' in FIGS. 1 and 6. FIG. 8 is a sectional view taken along the line G-G' in FIGS. 1 and 6.

A linear p-well 84 is formed on the n-type Si substrate 10. On the both sides of the p-well 84, a plurality of IGBT cells 24 are formed. A linear gate electrode 86 is formed on the p-well 84 via an oxide film 48. The gate electrode 86 is connected to the gate electrodes 46 of a plurality of IGBT cells 24 via the opening of the oxide film 48. The gate electrode 86 is covered with an interlayer insulating film 52. On the interlayer insulating film 52, a first emitter electrode 54 and linear lower layer gate wiring 14 are formed. The lower layer gate wiring 14 is connected to the gate electrode 86 via the opening of the interlayer insulating film 52. On the both sides of the lower layer gate wiring 14, first emitter electrodes 54 are connected to the $n^+$-type emitter regions 38 and $p^+$-type regions 40 via the openings of the oxide film 48 and the interlayer insulating film 52. A second emitter electrode 20 extends above the lower layer gate wiring 14 via an interlayer insulating film 66. Therefore, the lower layer gate wiring 14 is covered with the second emitter electrode 20, and is not exposed.

Figure 9:
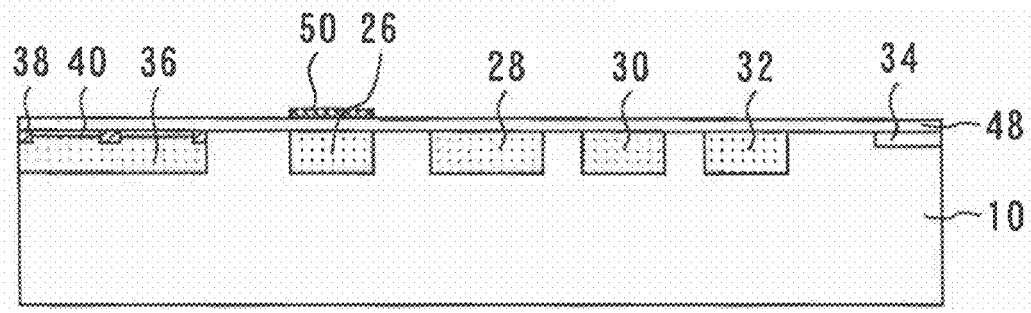
FIGS. 9 to 11 are sectional views showing the processes for manufacturing a semiconductor device according to the first embodiment of the present invention.
Figure 10:
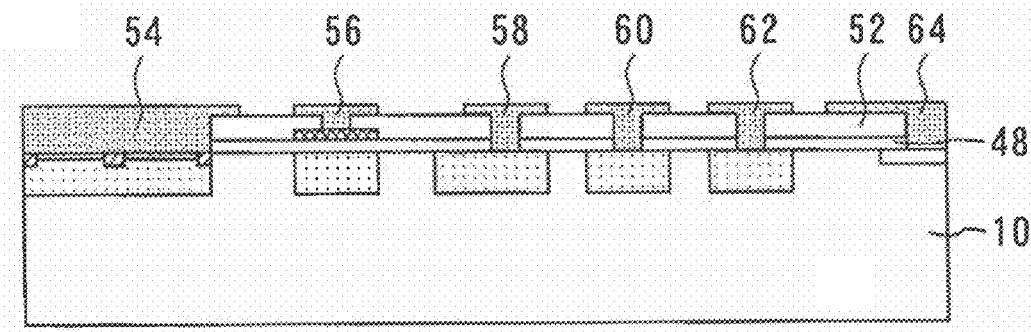
Figure 11:
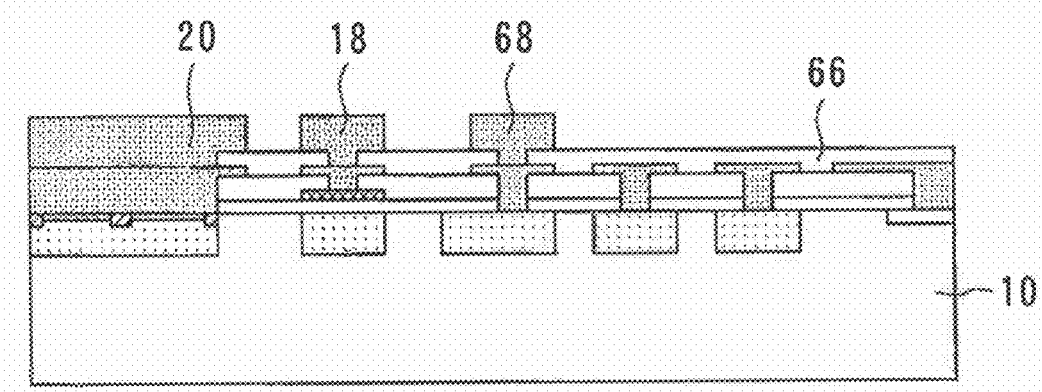

A method for manufacturing a semiconductor device according to the embodiments of the present invention will be described. FIGS. 9 to 11 are sectional views showing the processes for manufacturing a semiconductor device according to the first embodiment of the present invention.

First, as shown in FIG. 9, a diffusion region is formed on the upper surface of the n-type Si substrate 10. Then, an oxide film 48 is formed on the n-type Si substrate 10. A gate electrode 50 (86) is formed on a p-well 26 (84) via an oxide film 48.

Next, as shown in FIG. 10, an interlayer insulating film 52 is formed by deposition or the like, and openings are selectively formed in the oxide film 48 and the interlayer insulating film 52. Then, a film of a conductive material, such as aluminum is formed by sputtering or vapor deposition, and selectively etched to form a first emitter electrode 54, a lower layer gate wiring 56 (12, 14, 16), and a first field plate electrodes 58, 60, 62, and 64 simultaneously.

Next, as shown in FIG. 11, an interlayer insulating film 66 is formed by deposition or the like, and openings are selectively formed in the interlayer insulating film 66. Then, a film of a conductive material, such as aluminum is formed by sputtering or vapor deposition, and selectively etched to form a second emitter electrode 20, an upper layer gate wiring 18 and a second field plate electrode 68 simultaneously. Thereafter, the semiconductor device according to the present embodiment is manufactured through normal processes for manufacturing an IGBT.

Figure 12:
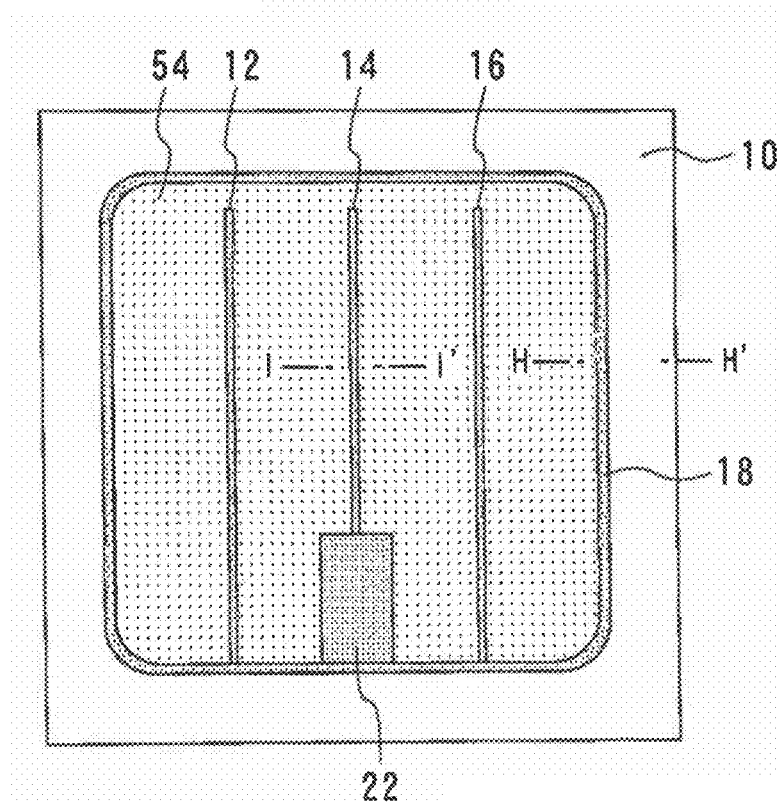
FIG. 12 is a top view showing a semiconductor device according to the first comparative example.
Figure 13:
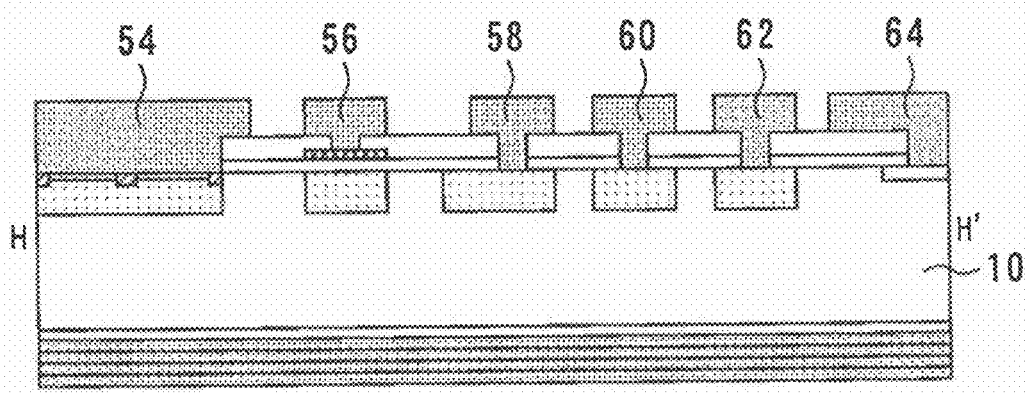
FIG. 13 is a sectional view taken along the line H-H' in FIG. 12.
Figure 14:
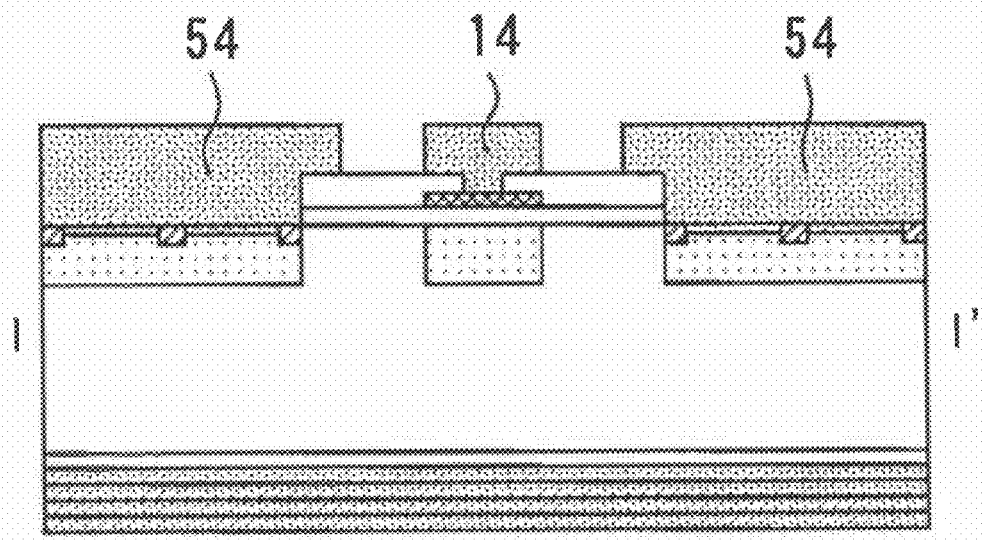
FIG. 14 is a sectional view taken along the line I-I' in FIG. 12.

The effect of the present embodiment will be described by comparing with a first comparative example. FIG. 12 is a top view showing a semiconductor device according to the first comparative example. FIG. 13 is a sectional view taken along the line H-H' in FIG. 12. FIG. 14 is a sectional view taken along the line I-I' in FIG. 12.

In the first comparative example, there is only one layer of each of a gate wiring, an emitter electrode, and a field plate electrode. Therefore, since the lower layer gate wirings 12, 14, and 16 are exposed on the center of the chip, the size of the first emitter electrode 54 is reduced.

Here, the gate electrode 46 of the IGBT cell is generally composed of polysilicon, and has a resistance higher than the resistance of lower layer gate wirings 12, 14, and 16 composed of Al. Therefore, a gap is caused in operating timings between a cell close to lower layer gate wirings 12, 14 and 16, and a cell far from the gate wirings. In order to reduce the gap, it is required to narrow the distances between the lower layer gate wirings 12, 14, and 16. Therefore, the number of the lower layer gate wirings 12, 14, and 16 cannot be reduced to enlarge the first emitter electrode 54.

On the other hand, in the present embodiment, the second emitter electrode 20 extends above the gate electrode 50 via the interlayer insulating film 66. Therefore, the second emitter electrode 20 can be enlarged compared with the first emitter electrode 54 in the first comparative example without reducing the number of the lower layer gate wirings 12, 14, and 16. Consequently, since the emitter potential of the second emitter electrode 20 becomes uniform in a chip, imbalance operation or oscillation can be suppressed.

Also in the first comparative example, since the lower layer gate wirings 12, 14, and 16 are exposed, it is required to carry out wire-bonding so as not to contact the lower layer gate wirings 12, 14, and 16. Therefore, the region for wire-bonding is narrow in the first emitter electrode 54. On the other hand, in the present embodiment, since the lower layer gate wirings 12, 14, and 16 are not exposed, the region for wire-bonding to the second emitter electrode 20 is wide.

In the present embodiment, the width of the upper layer gate wiring 18 is made larger than the width of the lower layer gate wiring 56. Thereby, the parasitic gate resistance in the chip can be reduced, and imbalance operation can be suppressed. The width of lower layer gate wirings 12, 14, 16, and 56 is set to be a width required to transmit the gate potential.

Also by adopting a guard-ring structure wherein ring-like p-wells 28, 30 and 32, and first field plate electrodes 58, 60, 62 and 64 are arranged on the terminating region, the depletion layer can be elongated in applying the gate voltage, and the voltage applied between the collector and the emitter can be maintained in turning the gate voltage off. The outermost channel stopper 34 is disposed to hold the depletion layer. Therefore, the breakdown voltage can be maintained in the terminating region.

In the first comparative example, the first field plate electrodes 58, 60, 62, and 64 and the first emitter electrode 54 are formed simultaneously. Since it is required to thicken the first emitter electrode 54 to improve wire-bonding characteristics, the field plate electrodes 58, 60, 62, and 64 are also thickened. Therefore, when the semiconductor device is transfer-molded in the first comparative example, due to difference in the coefficient of thermal expansion between molded resin and Si, and Al, the first field plate electrodes 58, 60, 62 and 64 slide due to the stress of the molded resin.

In the present embodiment, on the other hand, since the first field plate electrodes 58, 60, 62 and 64, and the second emitter electrode 20 are formed in separate processes, the first field plate electrodes 58, 60, 62, and 64 can be made thinner than the second field plate electrode 68. Thereby, the slide of the electrode due to the stress of the molded resin can be prevented.

In addition, by covering the first field plate electrodes 58, 60, 62 and 64 and second field plate electrode 68 with the protective film 70, the chip can be protected from moisture, stress, impurities or the like.

In the present embodiment, the first emitter electrode 54 and lower layer gate wirings 12, 14, 16, and 56 are formed simultaneously as the first field plate electrodes 58, 60, 62, and 64. Furthermore, the second emitter electrode 20 and the upper layer gate wiring 18 are formed simultaneously as the second field plate electrode 68. Thereby, the number of processes can be reduced, and the costs can be lowered.

Second Embodiment

Figure 15:
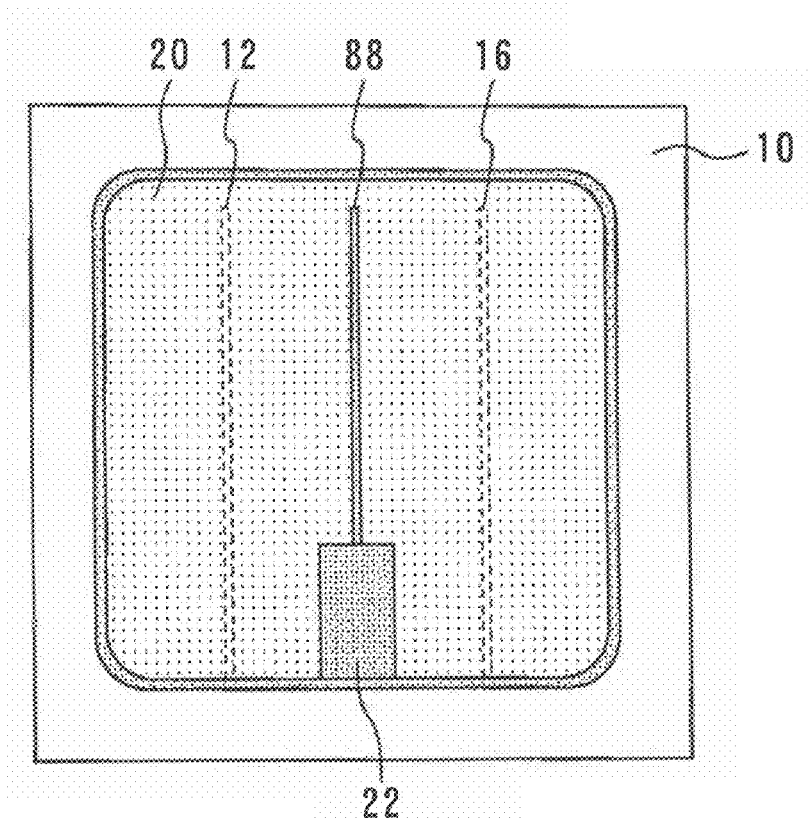
FIG. 15 is a top view showing a semiconductor device according to a second embodiment of the present invention.

FIG. 15 is a top view showing a semiconductor device according to a second embodiment of the present invention. FIG. 15 corresponds to FIG. 1 in the first embodiment. An upper layer gate wiring 88 is formed on the lower layer gate wiring 14 disposed in the center of the second emitter electrode 20 (center of the chip). Other constitutions are same as the constitution of the first embodiment.

If the freedom of wire bonding to the second emitter electrode 20 can be sufficiently secured, the upper layer gate wiring 88 can be formed also in the center of the second emitter electrode 20. Thereby, the gate resistance can be further reduced.

Third Embodiment

Figure 16:
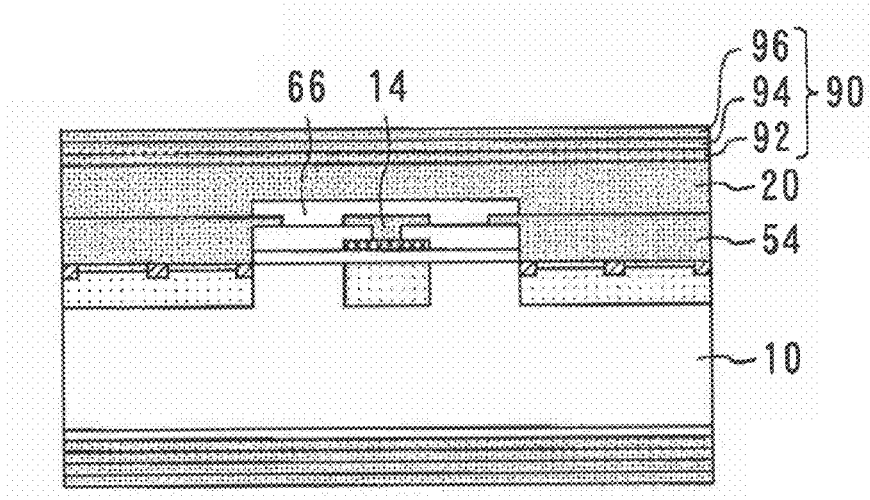
FIG. 16 is a sectional view showing a semiconductor device according to a third embodiment of the present invention.

FIG. 16 is a sectional view showing a semiconductor device according to a third embodiment of the present invention. FIG. 16 corresponds to FIG. 7 of the first embodiment. A third emitter electrode 90 is formed on the second emitter electrode 20. Other constitutions are same as the constitution of the first embodiment.

The third emitter electrode 90 has a Ti film 92, a Ni film 94, and an Au film 96 sequentially arranged from the second emitter electrode 20 side. These films are formed by methods, such as sputtering and vapor deposition, and selectively etched. Since the third emitter electrode 90 contains Ni, which is a soldering material, as described above, bonding by soldering is feasible.

If the lower layer gate wirings 12, 14, and 16 are exposed as in the first comparative example, the freedom of bonding by soldering is disturbed. In the present embodiment, on the other hand, the second and third emitter electrodes 20 and 90 are extended above the gate electrode 14 via the interlayer insulating film 66. Consequently, the degree of freedom for bonding by soldering is elevated.

By bonding using soldering, the on-resistance when applying current can be lowered in comparison with using wire bonding. As a result, the life until the bonding surface with the chip peels off can be elongated.

Fourth Embodiment

Figure 17:
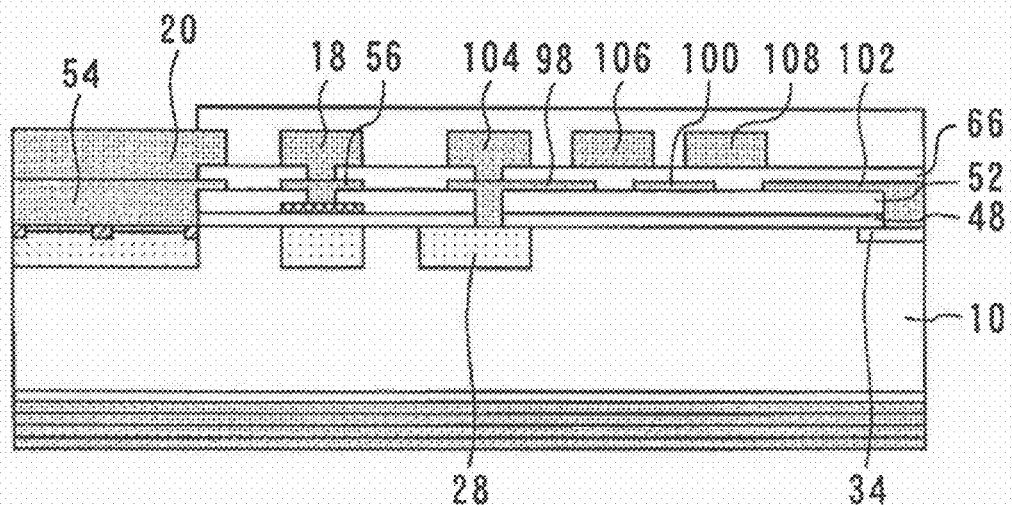
FIG. 17 is a sectional view showing a semiconductor device according to a fourth embodiment of the present invention.

FIG. 17 is a sectional view showing a semiconductor device according to a fourth embodiment of the present invention. FIG. 17 corresponds to FIG. 3 in the first embodiment. Only the constitution of the terminating region different from the first embodiment will be described. Other constitutions are same as the constitution of the first embodiment.

In the terminating region, first field plate electrodes 98, 100, and 102 composed of Al apart from each other are formed on the interlayer insulating film 52. The first field plate electrodes 98 and 102 are connected to the p-well 28 and the channel stopper 34 via the openings in the oxide film 48 and the interlayer insulating film 52, respectively. First field plate electrodes 98, 100, and 102 are covered with the interlayer insulating film 66.

Second field plate electrodes 104, 106, and 108 composed of Al apart from each other are formed on the interlayer insulating film 66. The second field plate electrode 104 is connected to the first field plate electrode 98 via the opening of the interlayer insulating film 52. The second field plate electrodes 106 and 108 are disposed on regions between adjoining first field plate electrodes 98, 100, and 102.

As described above, a field plate structure wherein the first field plate electrodes 98, 100, and 102 are capacitively coupled with the second field plate electrodes 104, 106, and 108 is adopted. Also in this case, in the same manner as in the first embodiment, the depletion layer can be elongated when applying the gate voltage, and the voltage between the collector and the emitter can be maintained when the chip is turned off. The outermost channel stopper 34 is provided to hold the depletion layer. Therefore, the breakdown voltage in the terminating region can be maintained.

Figure 18:
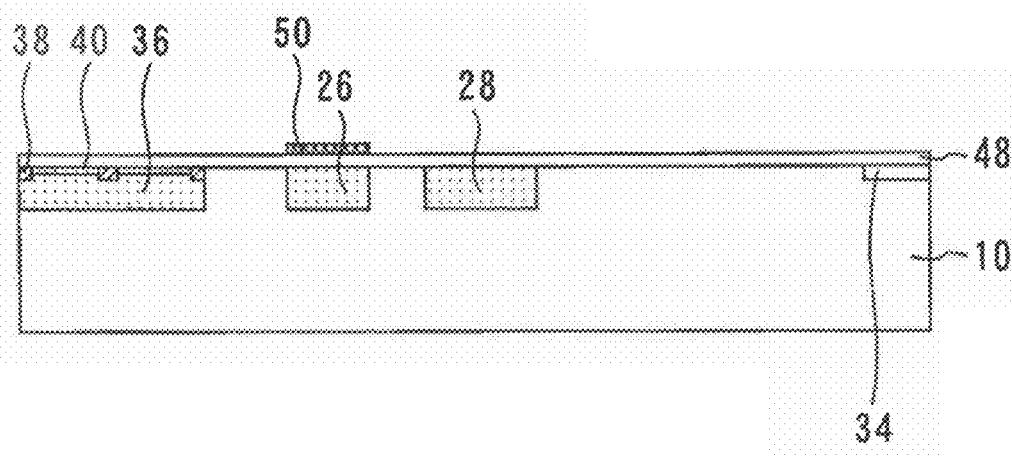
FIGS. 18 to 20 are sectional views showing the manufacturing processes of the semiconductor device according to the fourth embodiment of the present invention.
Figure 19:
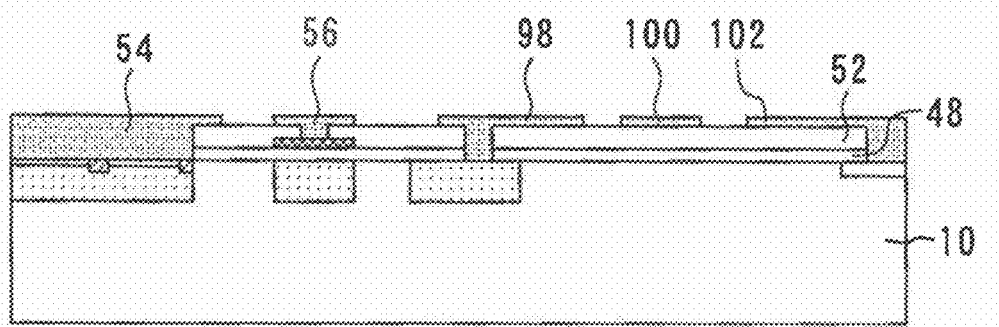
Figure 20:
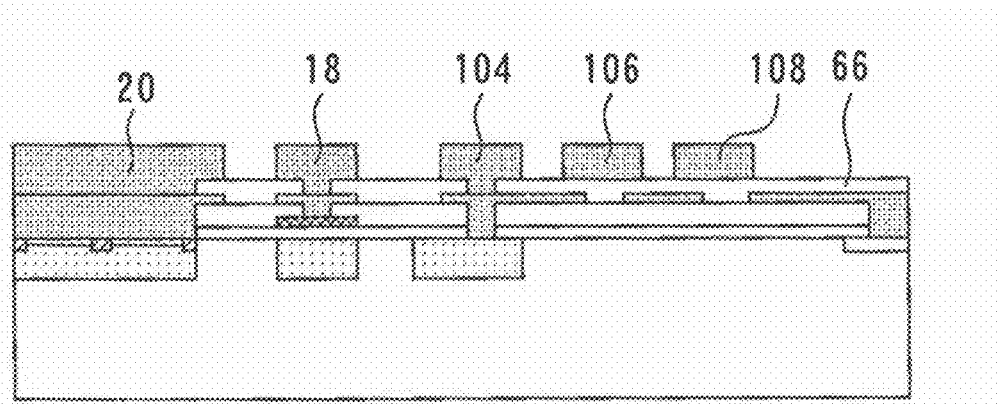

Next, a method for manufacturing a semiconductor device according to the fourth embodiment of the present invention will be described. FIGS. 18 to 20 are sectional views showing the manufacturing processes of the semiconductor device according to the fourth embodiment of the present invention.

First, as shown in FIG. 18, a diffusion region is formed on the upper surface of the n-type Si substrate 10. Then, on the n-type Si substrate 10 an oxide film 48 is formed. A gate electrode 50 (86) is formed on the p-well 26 (84) via the oxide film 48.

Next, as shown in FIG. 19, an interlayer insulating film 52 is formed by deposition or the like, and openings are selectively formed in the oxide film 48 and the interlayer insulating film 52. Then, a film of a conductive material, such as aluminum, is formed by sputtering or vapor deposition, and selectively etched to form a first emitter electrode 54, lower layer gate wirings 56 (12, 14, and 16) and first field plate electrodes 98, 100, and 102 simultaneously.

Next, as shown in FIG. 20, an interlayer insulating film 66 is formed by deposition or the like, and openings are selectively formed in the interlayer insulating film 66. Then, a film of a conductive material, such as aluminum, is formed by sputtering or vapor deposition, and selectively etched to form a second emitter electrode 20, an upper layer gate wiring 18, and second field plate electrodes 104, 106, and 108 simultaneously. Thereafter, the semiconductor device according to the present embodiment is manufactured through normal processes for manufacturing an IGBT.

Figure 21:
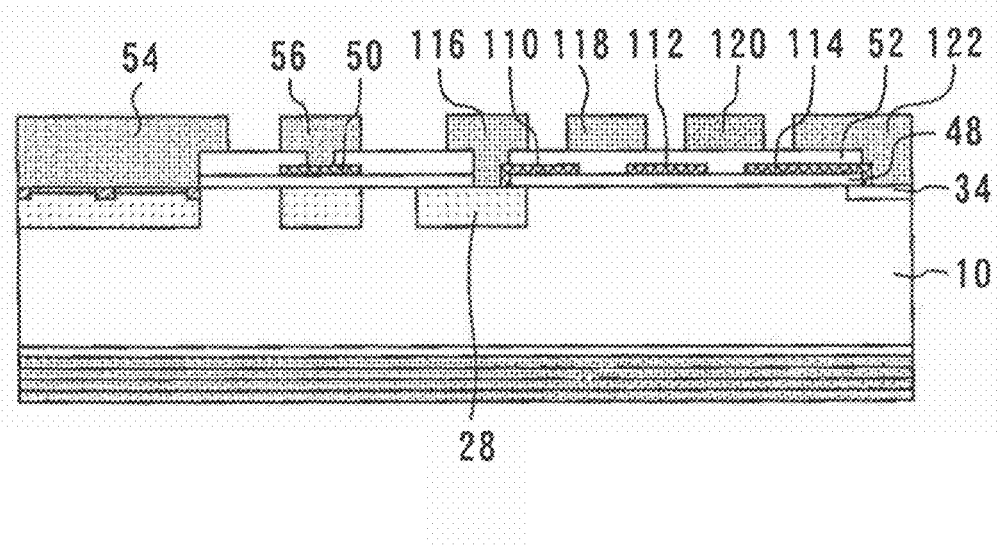
FIG. 21 is a sectional view showing a semiconductor device according to the second comparative example.

The effect of the present embodiment will be described comparing with the second comparative example. FIG. 21 is a sectional view showing a semiconductor device according to the second comparative example. In the second comparative example, there are only one layer of gate wiring and only one layer of emitter electrode. Therefore, first field plate electrodes 110, 112, and 114 are formed simultaneously as the gate electrode 50, and second field plate electrodes 116, 118, 120, and 122 are formed simultaneously as the first emitter electrode 54 and the lower layer gate wiring 56. Consequently, since the first field plate electrodes 110, 112, and 114 are composed of polysilicon, the manufacturing processes are subjected to restraints.

In the present embodiment, on the other hand, the first field plate electrodes 98, 100, and 102 are formed simultaneously as the first emitter electrode 54 and the lower layer gate wiring 56, and the second field plate electrodes 104, 106, and 108 are formed simultaneously as the second emitter electrode 20 and the upper layer gate wiring 18. Consequently, since the first field plate electrodes are composed of Al, the manufacturing processes are subjected to no restraints.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-197127, filed on Aug. 27, 2009 including specification, claims, drawings and summary, on which the Convention priority of the present application is based, are incorporated herein by reference in its entirety.

What is claimed is:

1. A semiconductor device comprising:
   a semiconductor substrate;
   a plurality of IGBT cells on the semiconductor substrate, each of the IGBT cells including a gate electrode and a first emitter electrode;
   a first gate wiring on the substrate and being connected to the gate electrode;
   an interlayer insulating film covering the first emitter electrode and the first gate wiring;
   a second emitter electrode on the interlayer insulating film and being connected to the first emitter electrode through an opening of the interlayer insulating film,
   wherein the second emitter electrode extends above the first gate wiring via the interlayer insulating film; and
   further comprising a third emitter electrode on the second emitter electrode and containing Ni.

2. The semiconductor device according to claim 1, further comprising:
   a second gate wiring on the semiconductor substrate, being connected to the gate electrode, and being covered with the interlayer insulating film; and
   a third gate wiring on the interlayer insulating film and being connected to the second gate wiring through an opening of the interlayer insulating film,
   wherein a width of the third gate wiring is larger than a width of the second gate wiring.

3. The semiconductor device according to claim 2, wherein the second gate wiring and the third gate wiring are disposed outside the second emitter electrode on the semiconductor substrate.

4. The semiconductor device according to claim 2, wherein the second gate wiring and the third gate wiring are disposed to surround the second emitter electrode on the semiconductor substrate.

5. The semiconductor device according to claim 1, wherein the third emitter electrode has a Ti film, a Ni film, and an Au film sequentially arranged from the second emitter electrode side.

6. The semiconductor device according to claim 1, further comprising:
   a first field plate electrode on a terminating region of the semiconductor substrate and being covered with the interlayer insulating film; and
   a second field plate electrode on the interlayer insulating film and being connected to the first field plate electrode through an opening of the interlayer insulating film.

7. The semiconductor device according to claim 1, further comprising:
   a plurality of first field plate electrodes on a terminating region of the semiconductor substrate, being apart from each other, and being covered with the interlayer insulating film; and a plurality of second field plate electrodes on the interlayer insulating film and being disposed on regions between adjoining first field plate electrodes.

8. The semiconductor device according to claim 6, wherein the first field plate electrode is thinner than the second field plate electrode.

9. The semiconductor device according to claim 6, further comprising a protective film covering the second field plate electrode.

* * * * *